United States Patent [19]
Kraft

[11] Patent Number: 5,528,510
[45] Date of Patent: Jun. 18, 1996

[54] EQUIPMENT PERFORMANCE APPARATUS AND METHOD

[75] Inventor: Christopher R. Kraft, Sherman, Tex.

[73] Assignee: Texas Instruments Incorporated, Dallas, Tex.

[21] Appl. No.: 340,010

[22] Filed: Nov. 15, 1994

Related U.S. Application Data

[63] Continuation of Ser. No. 663,969, Mar. 1, 1991, abandoned.

[51] Int. Cl.$^6$ ................................................ H01L 21/66
[52] U.S. Cl. .............................................................. 364/468
[58] Field of Search ........................................ 364/149, 150, 364/468, 488, 489, 490, 550, 551.01, 578, 579

[56] References Cited

U.S. PATENT DOCUMENTS

| | | | |
|---|---|---|---|
| 3,751,647 | 8/1973 | Maeder | 364/150 X |
| 4,571,685 | 2/1986 | Kamoshida | 364/150 X |
| 4,607,325 | 8/1986 | Horn | 364/150 X |
| 4,634,946 | 1/1987 | Moulds, III et al. | 364/150 X |
| 4,736,304 | 4/1988 | Doehler | 364/469 |
| 4,847,792 | 7/1989 | Barna et al. | |
| 4,873,623 | 10/1989 | Lane et al. | 364/188 |
| 4,965,742 | 10/1990 | Skeirik | 364/138 X |
| 4,972,367 | 11/1990 | Burke | 364/138 X |
| 5,067,099 | 11/1991 | McCown et al. | 364/150 |
| 5,088,045 | 2/1992 | Shimanaka et al. | 364/469 |

*Primary Examiner*—Ellis B. Ramirez
*Assistant Examiner*—Edward Pipala
*Attorney, Agent, or Firm*—W. James Brady, III; Richard L. Donaldson

[57] ABSTRACT

A process control system and method is described that yields improvement in product throughput through the use of tuned model process control using product and machine parametric data, process control via real time critical equipment transient monitoring, process windowing of critical equipment of equipment transients and machine/product parametric data correlation. A machine monitoring technique is described which allows precise machine utilization tracking independent of the physical machine process recipe set by the user. With the system, an objective analysis and comparison of machine utilization indices of like equipment in different factories which process different products with different machine recipes is possible.

1 Claim, 15 Drawing Sheets

```
          LITHOGRAPHY EQUIPMENT
           DAILY PRODUCTIVITY
EIPC WAFERS PROCESSED                    *
       25   26   27   28   29   30   1    TOTAL  UTILIZATION
NS701  0   256  438  422  601  313  585   2618    47.7%
NS702  0    0    0    0    0    0    0      0      0
NS703  0    0    0    0    0    0    0      0      0
NS704  0    0    0    0   48    0   86    134     2.9%
NS705  0   381  536  529  492  423   0    2361    44.4%
NS706  0    0   379  416  496  334  423   2048    38.8%
NS707  0   410  896  796  769  644  636   4151    73.8%
NS708  0   469  738  747  506  666  835   3961    70.0%

* TOTAL PARTS PROCESSED
```

FIGURE 3

```
SMS WAFERS LOGGED                        *
       25   26   27   28   29   30   1    TOTAL  UTILIZATION
NS701  0   143  403  403  410  378  383   2111    38.4%
NS702  0    0    0    0    0    0    0      0      0
NS703  0    0    0    0    0    0    0      0      0
NS704  0    0    0    0    0    0   48     48     1.0%
NS705  0   102  343  576  321  368  273   1983    37.3%
NS706  0    0   127  212  421  446  358   1566    29.7%
NS707  0   235  880  544  901  639  498   3697    65.7%
NS708  0   279  707  562  424  642  753   3367    59.5%

* TOTAL GOOD PARTS LOGGED FOR THE PERIOD
```

FIGURE 4

```
THEORETICAL MACHINE CAPABILITY           *
       25   26   27   28   29   30   1    TOTAL  REWORK
NS701  0   970  916  908  919  923  921   5494    9.2%
NS702  0    0    0    0    0    0    0      0     0.0%
NS703  0    0    0    0    0    0    0      0     0.0%
NS704  0   930  919  918  936   0   926   4629    1.9%
NS705  0   893  887  876  878  881  905   5320    7.1%
NS706  0   879  881  974  879  881  880   5274    9.1%
NS707  0   941  937  939  930  938  940   5625    8.1%
NS708  0   945  940  943  945  939  947   5659   10.5%

* DELTA BETWEEN TOTAL PROCESSED AND TOTAL GOOD PARTS LOGGED
```

FIGURE 5

| LEVEL | TOTAL WAFERS PROCESSED. UNIT OF TIME(24HRS) | AVERAGE EXPOSURE DOSE (mj/CM$^2$) | AVERAGE EXPOSURE INTENSITY (MW/CM$^2$) | (Te) EXPOSUREW TIME(ms) | (ne) SHOTS PER WAFER | NEGA |
|---|---|---|---|---|---|---|
| 1 | 096 | 188.9 | 753.3 | 251 | 78 | 8 |
| 2 | 142 | 158.2 | 751.6 | 210 | 78 | 8 |
| . | . | . | . | . | . | . |
| . | . | . | . | . | . | . |
| . | . | . | . | . | . | . |
| n | n | n | n | n | n | n |
| | 660 | $\overline{Mw}$ 170.6 | $\overline{Mw}$ 752.3 | $\overline{Mw}$ 226.5 | $\overline{Mw}$ 78 | $\overline{Mw}$ 8 |

Fig. 5a

TREND ANALYSIS
NS702 INTENSITY

| CNT | DATE/TIME | | INTENSITY | ENERGY |
|---|---|---|---|---|
| 75 | 10/19 | 11 : 31 : 10 | 333.95 | 180.34 |
| 76 | 10/19 | 11 : 29 : 34 | 371.20 | 185.60 |
| 77 | 10/19 | 11 : 29 : 19 | 338.08 | 185.94 |
| 78 | 10/19 | 11 : 28 : 56 | 342.20 | 184.79 |
| 79 | 10/19 | 11 : 28 : 38 | 331.66 | 182.42 |
| 80 | 10/19 | 11 : 27 : 28 | 369.82 | 184.91 |
| 81 | 10/19 | 11 : 26 : 49 | 345.40 | 186.52 |
| 82 | 10/19 | 11 : 26 : 32 | 346.47 | 187.09 |
| 83 | 10/19 | 11 : 09 : 57 | 346.01 | 186.85 |
| 84 | 10/19 | 11 : 09 : 36 | 373.94 | 186.97 |
| 85 | 10/19 | 11 : 08 : 52 | 372.88 | 186.44 |
| 86 | 10/19 | 10 : 56 : 01 | 340.06 | 170.03 |
| 87 | 10/19 | 10 : 55 : 39 | 373.79 | 171.94 |
| 88 | 10/19 | 10 : 55 : 26 | 345.25 | 172.62 |
| 89 | 10/19 | 10 : 55 : 14 | 340.21 | 173.51 |
| 90 | 10/19 | 89 : 10 : 30 | 276.23 | 28334.00 |
| 91 | 10/19 | 10 : 10 : 36 | 360.97 | 166.05 |
| 92 | 10/19 | 10 : 10 : 13 | 355.17 | 163.38 |
| 93 | 10/19 | 10 : 09 : 55 | 355.32 | 163.45 |
| 94 | 10/19 | 10 : 07 : 35 | 319.76 | 156.68 |
| 95 | 10/19 | 10 : 07 : 16 | 358.22 | 164.78 |

FIGURE 8

Sheet Reisistance – Run Summary

| | |
|---|---|
| Run Number : | 20 |
| Predicted Sheet Resistance | 10.2 |
| Actural Sheet Resistance: | 10.1 |
| | 10.3 |
| | 10.3 |
| Delta (Actual – Predicted): | 0.03 |

EQUIPMENT PERFORMANCE APPARATUS AND METHOD

This application is a continuation of application Ser. No. 07/663,969, filed Mar. 1, 1991, now abandoned.

FIELD OF THE INVENTION

This invention relates to apparatus and method for accurate measurement of machine utilization, and more particular generic apparatus and methods of accurately monitoring and controling semiconductor manufacturing processes.

BACKGROUND OF THE INVENTION

Advanced lithography is a key factor in microelectronic integration. Advanced lithography capability requires a high capital investment for the IC manufacture. The need for accurate machine utilization tracking is driven by increasing pressure to reduce semiconductor wafer cost by maximizing current machine utilization. A generic apparatus and method of accurately tracking the utilization of advanced lithography systems across a diversified mix of technologies is required in order to remain competitive in todays market.

Various methods of semiconductor machine utilization tracking are currently in use throughout the semiconductor industry. Most manufacturers utilize some type of utilization tracking algorithm which calculates a percentage of machine usage per unit of time. These systems require manual data entry through a stand alone computer network system. Data input is typically performed by those individuals responsible for operating or maintaining the equipment. In some instances, the individual is one and the same. This type of machine utilization tracking system is very subjective and does not always provide accurate machine utilization indices.

Another approach has been to record the number of good parts processed through the machine over a defined period of time and calculate machine utilization base on the theoretical best case performance. There are many basic problems with this type of utilization tracking approach. This type of utilization tracking method does not comprehend technology mix being processed through the machine, reworked wafers cycled back to the unit, machine condition during process, or performance change due to piece part degradation. Piece part degradation alone such as UV source can have a significant impact on machine productivity performance. Since UV steppers utilize a light integrator to compensate for fluctuation in lamp intensity by adjusting the shutter time to deliver constant energy to the image plane, the only noticeable effect of intensity loss during aging of the lamp, assuming uniform intensity distribution, is reduced throughput.

SUMMARY OF THE INVENTION

A method and equipment interface is utilized to receive and monitor real time equipment inputs. The real time inputs are used to monitor the machines critical processing parameters as well as its productivity performance. The method herein referred to as Equipment Interactive Process Control (EIPC). The EIPC interface monitors the critical machine parametric values through a computer interface. Software within the computer allows machine analog and digital signals to be processed and converted to engineering units for analysis. The EIPC data allows the user to utilize a quantitative machine model created by the machine manufacturer to measure the actual machine performance, in real time, independent of the technology being passed through the machine. By providing a real time measure of the machine performance, accurate machine utilization can be tracked as well as machine process performance.

The technical advance represented by the invention as well as the objects thereof will become apparent from the following description of a preferred embodiment of the invention when considered in conjunction with the accompanying drawings, and the novel features set forth in the appended claims.

BRIEF DESCRIPTION OF THE DRAWINGS

FIG. 3 illustrates an on-line summary of daily productivity of EIPC wafers processed during one week;

FIG. 4 illustrates an on-line summary of SMS semiconductor wafers logged during one week;

FIG. 5 illustrates theoretical machine productivity during one week;

FIG. 5a lists the machine process control variables generated by the EIPC program.

FIG. 8 is a trend analysis for exposure intensity and energy used;

DESCRIPTION OF A PREFERRED EMBODIMENT

Figure 1:
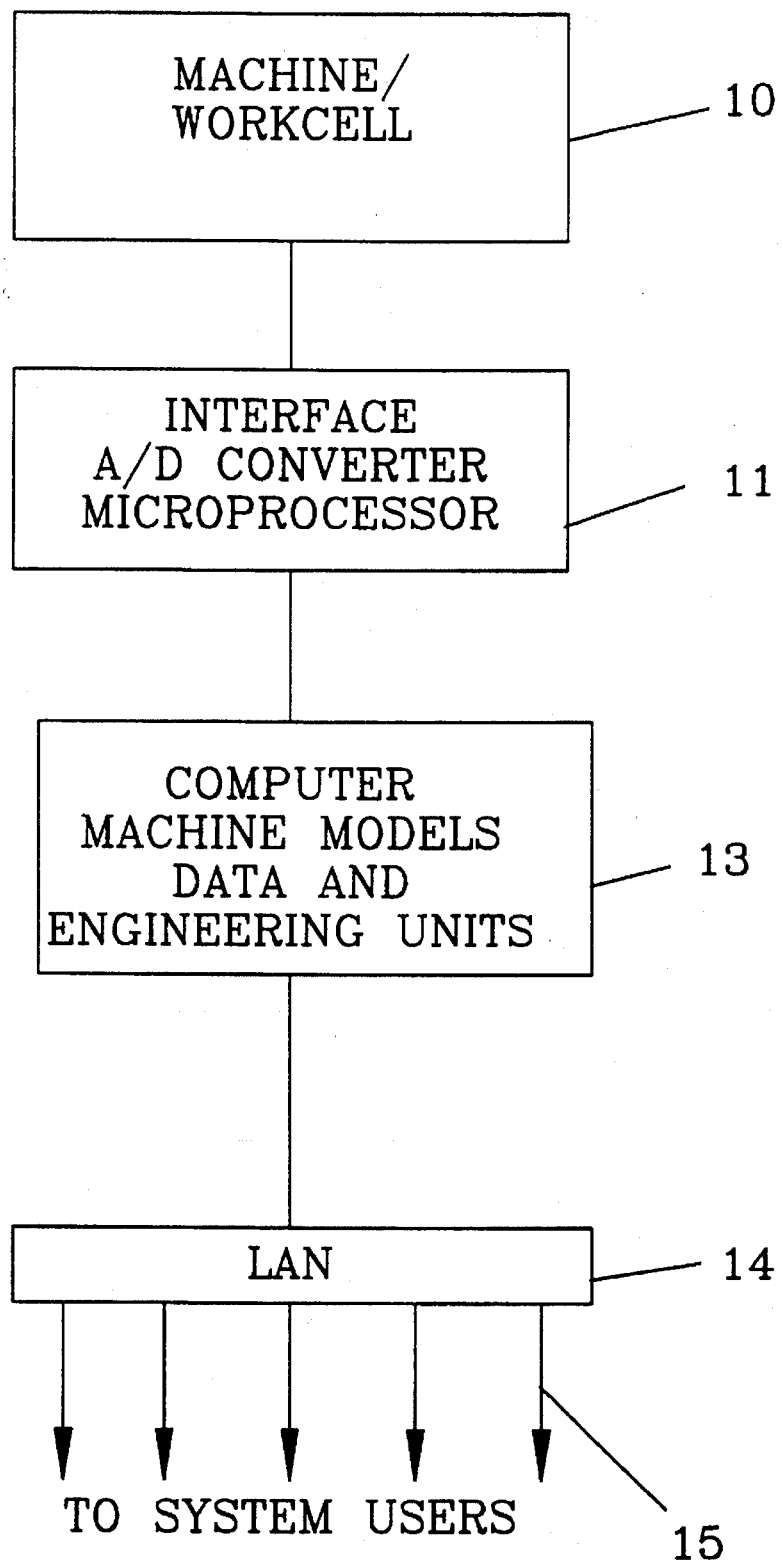
FIG. 1 is a block diagram illustrating the system interface and controls of the present invention.

FIG. 1 is a block diagram of the system illustrating the interface and control monitoring system of the present invention. A machine or work cell 10 which has an automated process controller is connected to an interface and analog-to-digital converter 11 which serves as an "equipment monitor and control adaptor". Interface 11 includes a microprocessor for interfacing the machine/work cell to a processor in block 13. Interface 11 is connected to a processor 13, which maybe, for example, 386 PC or similar computer capable of handling the control software which includes machine models for the type of equipment being monitored and the engineering data. Processor 13 is connected to a Large Area Network (LAN) which is connected to one or more system users 15.

Figure 2:
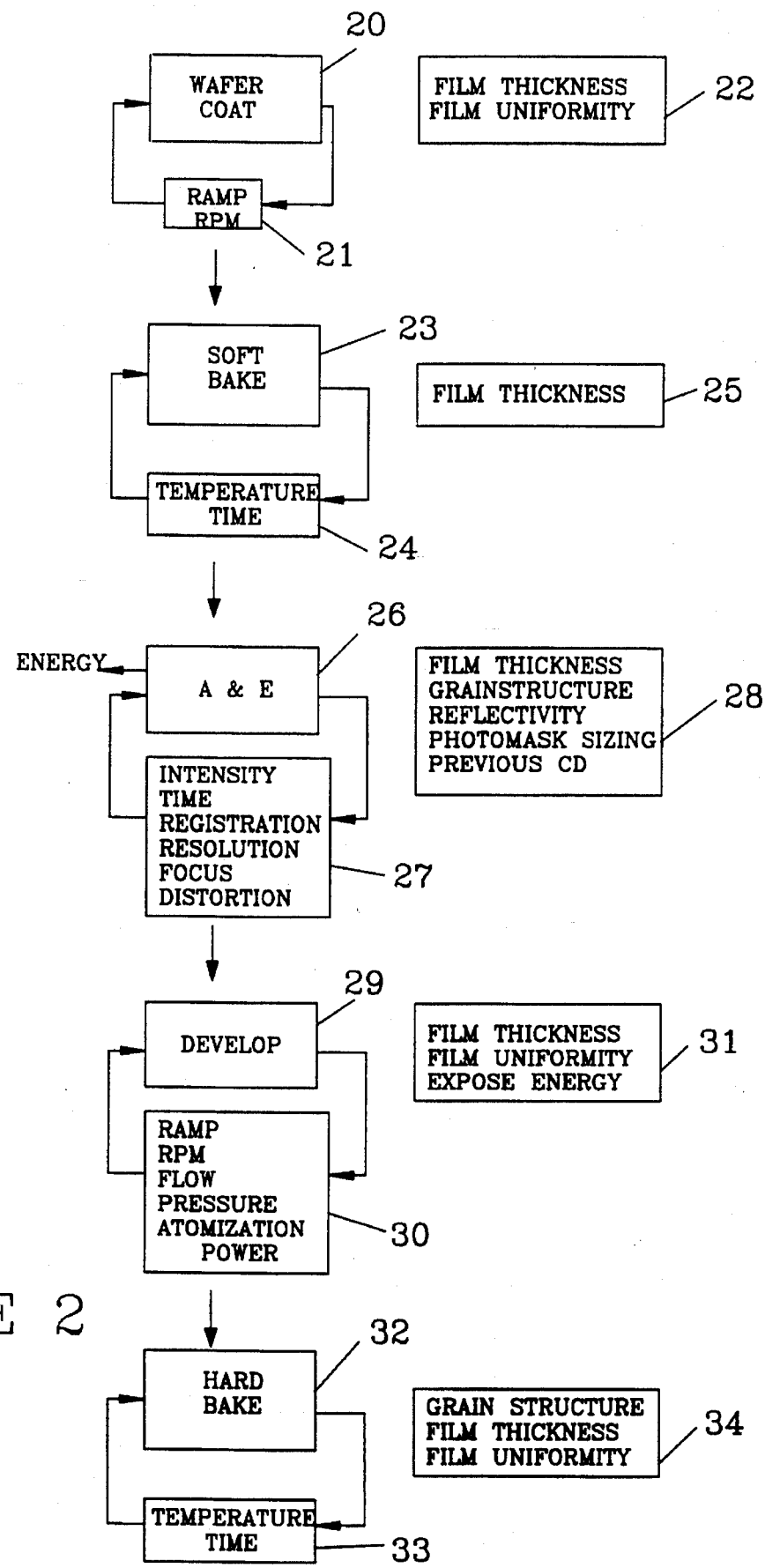
FIG. 2 illustrates a process flow in a wafer processing work cell.

FIG. 2 details the work flow through a work cell for coating semiconductor wafers with a photo resist material, exposing a pattern in the photo resist coating, and then developing and processing the coating. A brief description of the work cell process is given to illustrate a monitor process by the present invention, and to show how, in examples to follow, how particular processes are monitored on a real time basis, and compared with machine models to measure system performance.

The basic process flow in the work cell is as follows. A semiconductor wafer is introduced into the work cell which is environmentally controlled. A wafer is coated (20) with a photo resist material. The coating is spun on while the wafer is on a rotating table. The rpm speed and ramp (21) is controlled, as well as the amount of photo resist applied, and the time of spinning. The important process control factors at this point are listed in box (22). These factors are photo resist film thickness and film uniformity which are measured and fed forward to the next process module for process adjustment.

Next, the photo resist is baked, soft bake (23), to harden the photo resist coating. Control factors in the soft bake cycle (24) are temperature and time. Again film thickness is an important factor which is measured and fed forward to the bake module for possible parameter adjustment required for process recenterin of the film thickness and uniformity to target.

After the photo resist coating has been soft baked, the wafter is aligned under a mask and the photo resist coating is exposed (26) to produce a pattern in the photo resist coating. Parameters (27) important during exposure are the intensity of the exposing light and the time length of the exposure. During alignment, the mark registration, resolution, focus and distortion are considered during alignment and prior to exposure.

The energy and intensity are two of the parameters monitored in the present invention, which are fed forward to the next module for machine variation compensation.

Other factors (28) to be considered during the this process step are photoresist film thickness, underlying topography of the wafer oxide or metal grain, reflectivity, and photo mask sizing.

The photo resist coating and exposed image is developed (29) to remove areas of photo resist coating not defined by the pattern. Developer is spun onto the wafer surface. Factors (30) in development are ramp speed (rpm, developer flow, pressure and atomization power. Factors of importance (31) are film thickness, film uniformity and exposure energy which are measured and fed forward to the develop module for process variation compensation.

The wafer is then hard baked (32) to harden the pattern of developed photo resist material. Time and temperature (33) are important factors during hare bake. Characteristics (34) to be considered are the underlying metal grain structure, film thickness and uniformity, and wafer topography.

Most lithography processes used in the manufacture of microelectronic devices use ultraviolet light to expose a thin film of photoresist deposited on the surface of a silicon wafer. The equipment used to perform this task normally utilizes a light integrator to compensate for variations in light source intensity by adjusting the exposure time to deliver a constant energy dose to the image plane.

Uniform intensity distribution at the image plane is another important characteristic of a good expose system. The uniformity of the intensity distribution is related to light source intensity. Therefore, there is a desirable intensity range for equipment to operate within.

Exposure failures usually go undetected until material reaches an inspection step in the process flow. This can be several process steps after the exposure was done. By the time a failure of this type is detected, a significant amount of material may have been processed through a faulty expose machine in a work cell.

FIGS. 3, 4 and 5 illustrate on-line data that is available from the system of the present invention that is received from the machine/work cell 10 of FIG. 1. The data is displayed on a real time basis to the processor 13, and stored for use by the system users.

FIG. 3 is a listing of productivity on a daily basis, for a period of one week (25th through the 1st of the following month). This data is for the number of EIPC wafers processed through lithography equipment units NS701 through NS708. The number of wafers process by each unit is displayed on a daily basis, the total wafers processed for the seven day period, and the model based percentage of utilization of the equipment. The data is also available on a real time display basis.

FIG. 4 illustrates the same data for SMS wafers logged, i.e. good parts logged, on the same equipment during the same time period.

FIG. 5 is data generated by the model of theoretical machine capability for the same equipment (NS701–NS708). The theoritical potential number of daily wafers processed, total theoretical processing for the week, and percent of wafers reworked are shown. The REWORK percentage is the ratio of total parts processed and the total "good" parts logged.

The present invention uses a program that interfaces and monitors the critical machine parametric values . By providing a real time measurement of the machine performance accurate machine utilization is tracked as well as the machines process performance.

A model in use is based on the machine manufacturers model. The following is a model for a Step and Repeat system manufacture by Nikon Precision Inc. The model is for a Nikon 1505G4 Step and Repeat system.

NSR Throughput: field-By-Field and Wafer Global Alignment

Field size = 15 mm × 15 mm $$N = \frac{3600}{(Ts + Te) \times ne + Ta + Tlsa \times nlsa}$$

N = Wafers Processed Per Hour (Physical Machine Capability)
 *Ts = Stepper and Focusing Time
  Te = Exposure Time
  ne = Exposure Number
 *Tlsa = Laser Sight Alignment Time
  nlsa = Number of LSA Alignments
 *Ta = World Global Alignment and Wafer Changing Time NSR Throughput: Enhanced Global Alignment -continued $$N = \frac{3600}{(ts + Te) \times ne + Ta + (Tega \times nega) + Tcal}$$

*Tega = Enhanced Global Alignment Time
nega = Number of EGA Executions
*Tcal = System Variations Compensation Time The variables designated with an asterisk are defined by the Manufacturer for the NSR 1505G4. N is calculated based on these variables and the variables Te, ne, nlsa, and nega. Te, ne, nlsa, and nega are technology dependent. The variables Te and ne must be input into the model real time via the system interface in order to accurately calculate physical machine performance based on the manufacturer's specification as well as the current machine condition and technology being processed on the machine.

FIG. 5a details the machine/process control measurements taken by the Equipment Interactive Process Control Program (EIPC). Since each machine typically processes various levels each with its own exposure and alignment criteria, a weighted average must be calculated and the manufactures model modified for Te and ne:

$$Mw \ Te = \frac{SUM1 - n \ (Wp \times Te \times S/w)}{SUM1 - n \ Wp \times s/w}$$

$$Mw \ ne + \frac{SUM1 - n \ (Wp \times s/w)}{TWPbn}$$

Where:
Wp=Wafers Processed For Each Specified Level (EPIC measured)
s/w=Shots per Wafer (EPIC measured)
TwPbn=The SUM of Total Wafers Processed for Each Level Tested The modified manufacturer's model is now used to calculate the exact machine physical utilization independent of the technology being processed through the machine. The manufacture's model now becomes:

NSR Throughout: Field-By-Field and Wafer Global Alignment

Field Size = 15 mm × 15 mm $$N = \frac{3600}{\left[\left(Ts + \frac{SUM1 - n(Wp \times \overline{Te} \times s/w)}{SUM1 - n(Wp \times s/w)}\right) \times \frac{SUM1 - n \times \overline{Te} \times s/w}{TWPbn}\right] + Ta + (Tlas \times nlsa)}$$

Solving for N:

$$N = \frac{3600}{\left[\left(Ts + \frac{SUM1 - n(Wp \times s/w)}{TWPbn}\right) \times \frac{SUM1 - n \times \overline{Te} \times s/w}{TWPbn}\right] + Ta + (Tlas \times nlsa)}$$

NSR Throughput: Enhanced Glogal Alignment $$N = \frac{3600}{(Ts + Te) \times ne + Ta + (Tega \times nega) + Tcal}$$

The EGA model then becomes:

$$N = \frac{3600}{\left[\left(Ts + \frac{SUM1 - n(Wp \times s/w)}{TWPbn}\right) \times \frac{SUM1 - n \times \overline{Te} \times s/w}{TWPbn}\right] + Ta + (Tega \times nega) + Tcal}$$

If the displayed data is input into the model using the following manufacturers constants and the associated EIPC input variables for masking levels 1 through N, the exact machine physical utilization performance can be calculated, which is independent of technology. Using the derived EGA weighted average model:

Ts = 0.42 sec. (Nikon Fixed)
Te = 0.2665 Sec (EIPC Meas.) [Opt. 0.213 sec @ 800 Mw/Cm$^2$
ne = 78 (EIPC Meas.)
TA = 29 sec. (Nikon Fixed)
Tega = 1.28 Sec 125 mm (Nikon Fixed)
Nega = 8 (Device/Level Defined)
Tcal = 2.0 sec. (Nikon Fixed)
TWP = 660 (EIPC Meas.)
Field Size 15 mm × 15 mm Solving for N:

$$N = \frac{3600}{(0.42 + 0.2265) \times 78 + 29(1.28 + 8) + 2.0}$$

Therefore N=39.69 W/H for weight mean intensity=752.2 MW/Cm$^2$

If the total EIPC wafer count for a 24 hour period of 660 is taken and divide it by 24, a mean W/H (wafer per hour) count of 27.5 is achieved.

The physical utilization of machine NS708 for a 24 hour period is now a ratio of actual parts processed as compared to the manufacturer's specified performance for that machine under the parametric input conditions as monitored by the EIPC program/system.

$$\text{Physical Machine Utilization} = \frac{660/24}{39.69} = 69.3\%$$

for the period.
The number 660/24 assumes the weighted exposure time average (Mw Te) and the weighted number of exposures (Mw Ne) for the remaining levels processed for the time period tested to be same. Only levels 1 and 2 were averaged to simplify this example calculation.

The model permits the comparison of actual machine utilization under the current conditions to optimum machine capability under ideal lamp conditions. If the maximum lamp intensity capability of the machine is 800 MW/Cm$^2$, the weighted Te value then becomes 0.213 sec. the maximum machine physical capability then becomes 40.1 W/H. Under these conditions, the actual machine utilization would then be reduced to 68.5%.

Figure 6:
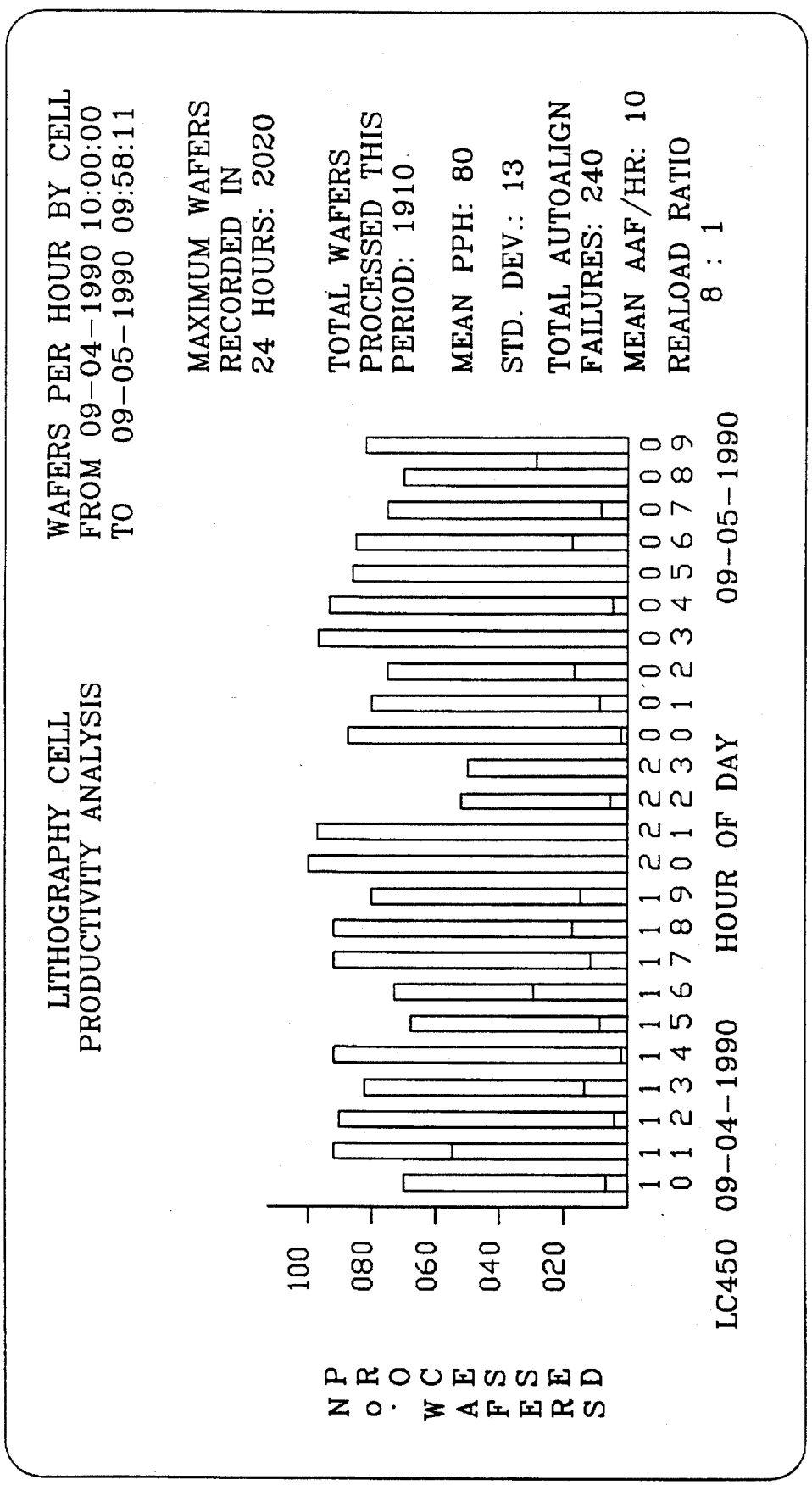
FIG. 6 is a computer display of a lithography productivity analysis.

FIG. 6 is a bar chart of a proximity lithography cell productivity analysis. The chart covers 24 day period and shows a total of 1910 wafers processed for the period and a mean wafers per hour of 80. Total autoalign failures for the period was 240 wafers. The number of failures are the lines across the bars. This display is available on-line from the system computer.

Figure 7:
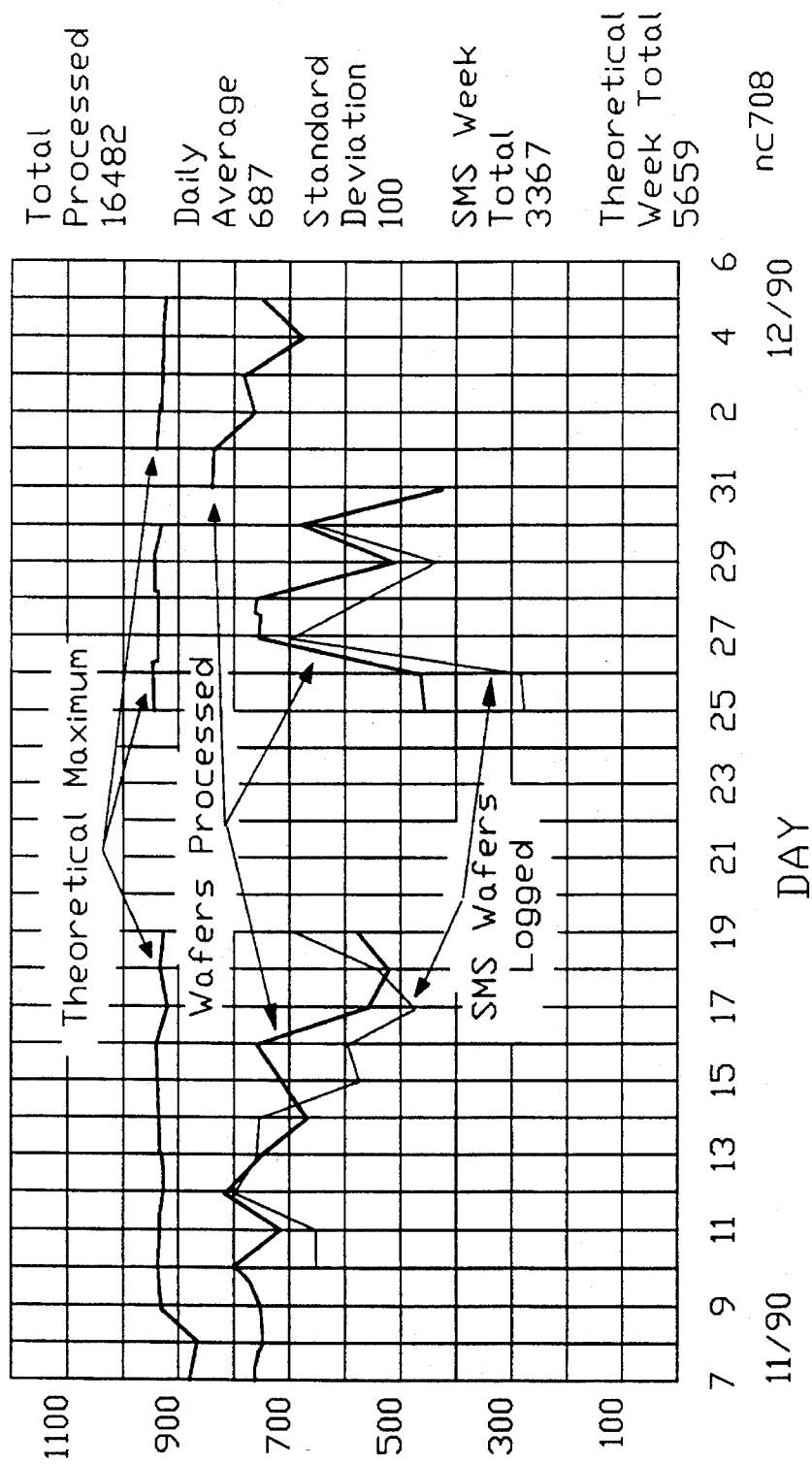
FIG. 7 illustrates daily throughput showing theoretical maximum, number of wafers processed and the number of good wafers logged.

FIG. 7 is a chart available on-line from the computer showing photolithography daily throughput. The number of wafers processed is shown and compared with the theoretical maximum of wafers that can be processed in the photolithography work cell. Also shown is the number of SMS wafers logged. Statistical data is displayed at the right side of the chart.

FIG. 8 is a trend analysis available for each processing machine. FIG. 6 is for machine NS702. Illustrated is wafer number, date and time processed, light intensity and energy used in providing the exposure. To illustrate that on line errors may be detected, the time and energy for wafer 90 shows erroneous data. The bad exposure of wafer #90 saturated the exposure scale causing auto-machine shutdown by EIPC hardware/software. There was a 45 minute downtime between wafer #89 and wafer #91 due to the failure.

Figure 9:
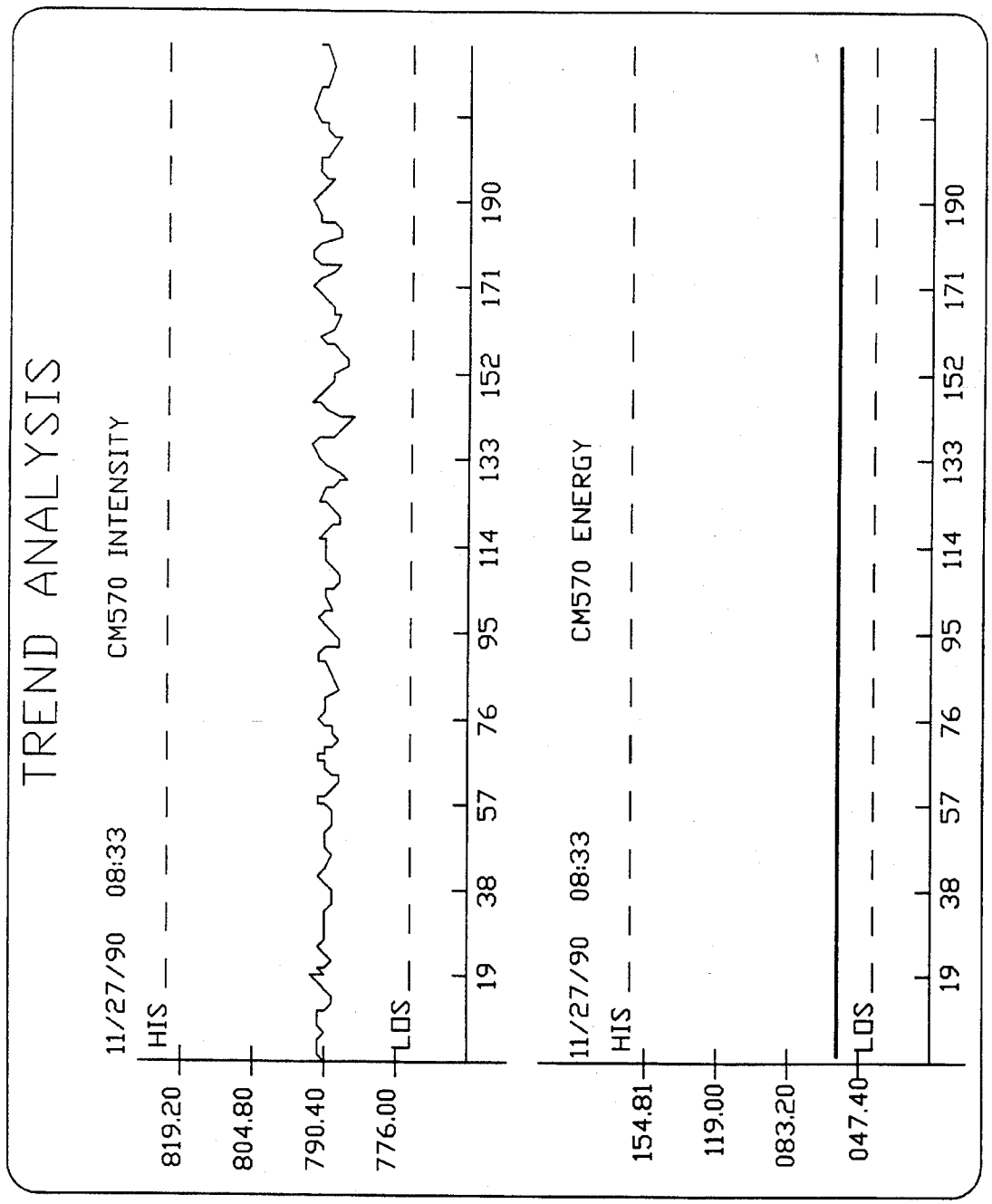
FIG. 9 is a trend analysis of intensity and energy.

FIG. 9 is a TREND ANALYSIS in graph form for intensity and energy of a projection lithography cell. This display is available on a real-time basis from the system.

Figure 10:
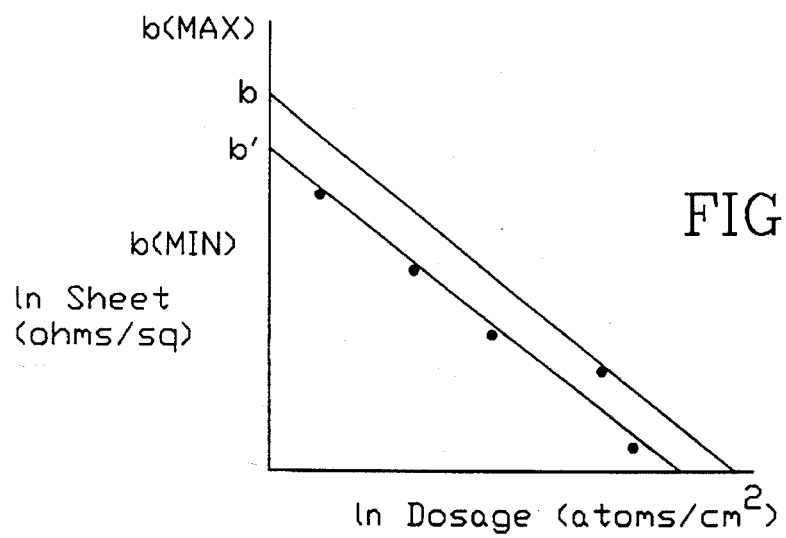
FIG. 10 illustrates, in graph form, the desired usage range used in a control algorithm (tuned model) process control using wafer parametric data.

Another example of process control monitoring of the present invention, is a tuned model process control using semiconductor wafer and machine parametric data. Software programs merge data from many processes within a single piece of equipment that is interfaced to the system. The merge occurs through the use of wafer/machine control algorithms that span the desired usage range of the equipment. A example of this is illustrated in FIG. 10. For example, an implanter uses the ln-ln relationship between dosage and implant sheet resistance. As equipment variations occur, the actual measured run wafer data could start falling below the expected value.

When the delta from the expected value [(in (actual sheet)—in (expected sheet)] is trended by a run, a drift away from the expected value is detected by the system program. The program then recalculates the best fit algorithm through recent data (retune the model), and determines a new coefficient b'. To prevent an operation from drifting too far from a "perfect" process, a process window [(b(max)–b(min)] is define that forces an operation shutdown if b' exceeds the allowed adjusted window.

Figure 11:
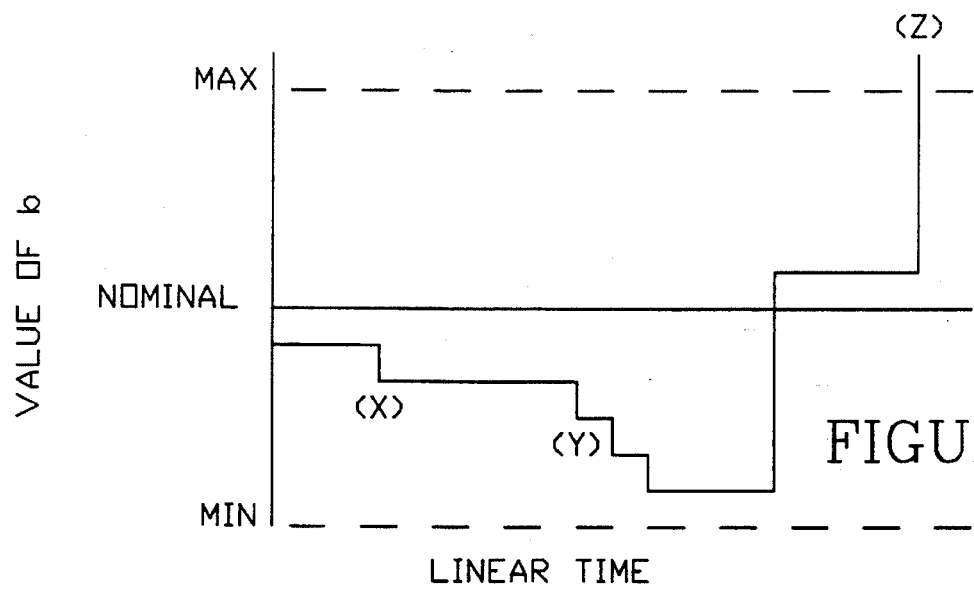
FIG. 11 illustrates an algorithm shift of FIG. 10.

To address the problem of (b), the program statistically analyzes the changing of the control coefficients with time. This is demonstrated in FIG. 11. The region (X) demonstrates the previously described algorithm shift from b to b'. Region (Y) indicates a rapid changing equipment/process shift. Region (Z) indicates an equipment/process shift that is too large for the program to be allowed to compensate for (beyond the process window), thus shutting down the equipment operation.

Figure 12:
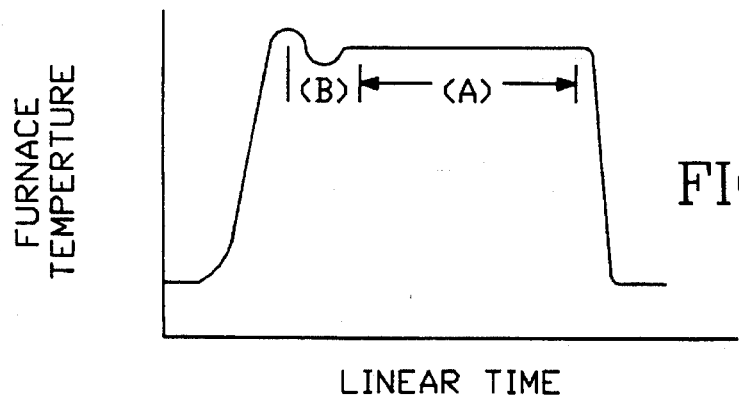
FIG. 12 illustrates monitored data in the system of the present invention.

As pointed out, with reference to FIG. 1, the system monitors process performance based on wafer/machine models and generates continuous transient window limits based on the expected machine performances. The expected machine performances is based on fed forward process data inserted into the model. Transient deviation outside of any of the program generated window limits triggers an alarm sequence to alert the system operator or engineer. The alarm sequence aids in problem diagnostics and solving. An example of machine transient is illustrated in FIG. 12. In region (A) the duration of the region, the absolute temperature at region start, and the slope of the line is of interest. In Region (B), the number of inflections, the max and min temperatures observed, and the duration of the region are all of interest. The program/system provides a method to identify both catastrophic and subtle variation in equipment performance from run to run. It allows in-situ process adjustment upon detection of a sensor measured variation from normal.

Figure 13:
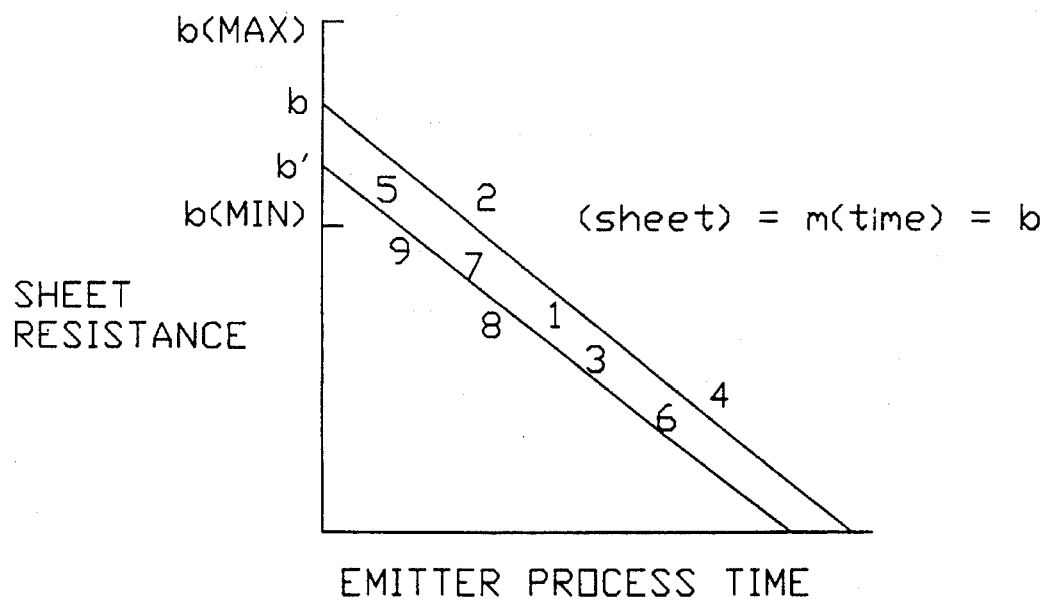
FIG. 13 illustrates, in graph form, the control algorithm used in monitoring sheet resistance for base diffusion as a function of time.
Figure 14:
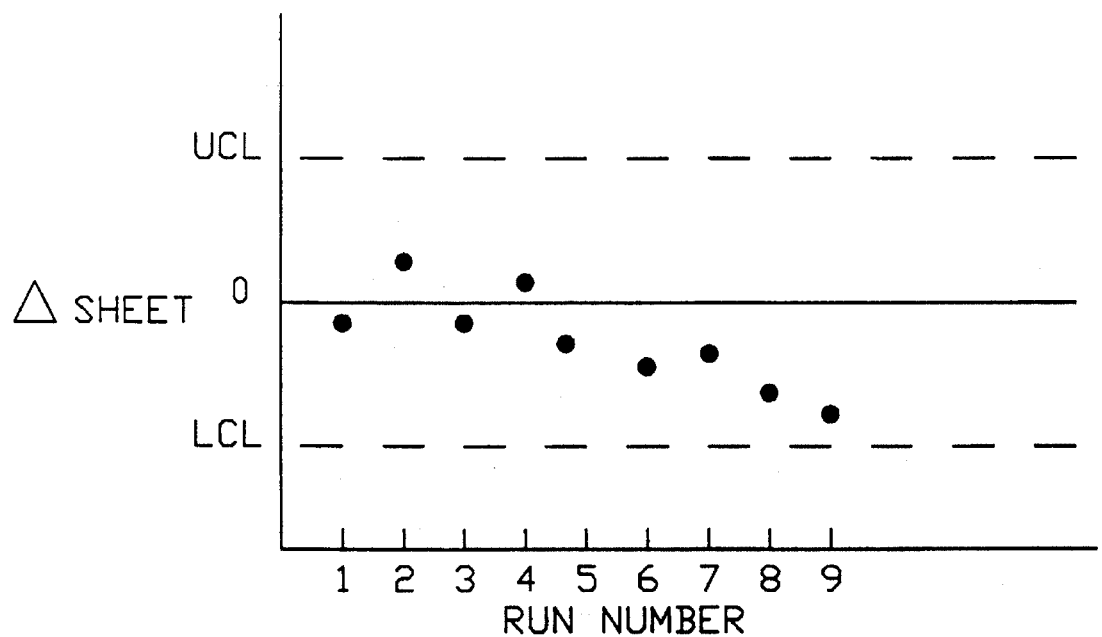
FIG. 14 illustrates a deviation from model prediction of wafer measurement of specified production runs in the process of FIG. 13.
Figure 15:
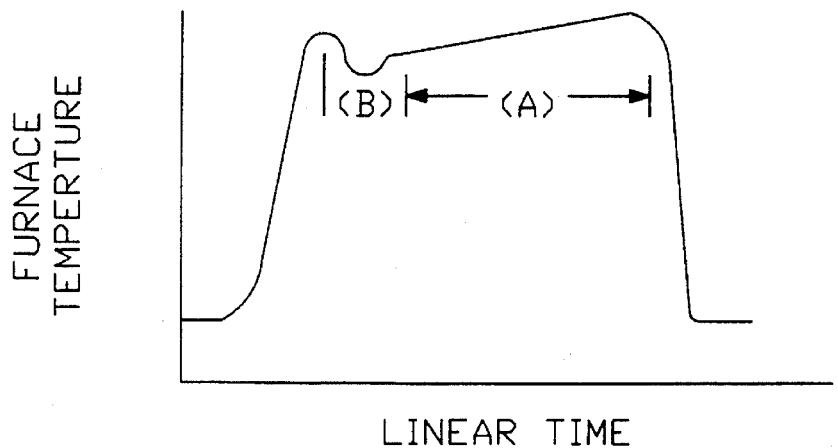
FIG. 15 illustrates the deviation of furnace temperature which is responsible for the process shift seen in FIG. 14.
Figure 16:
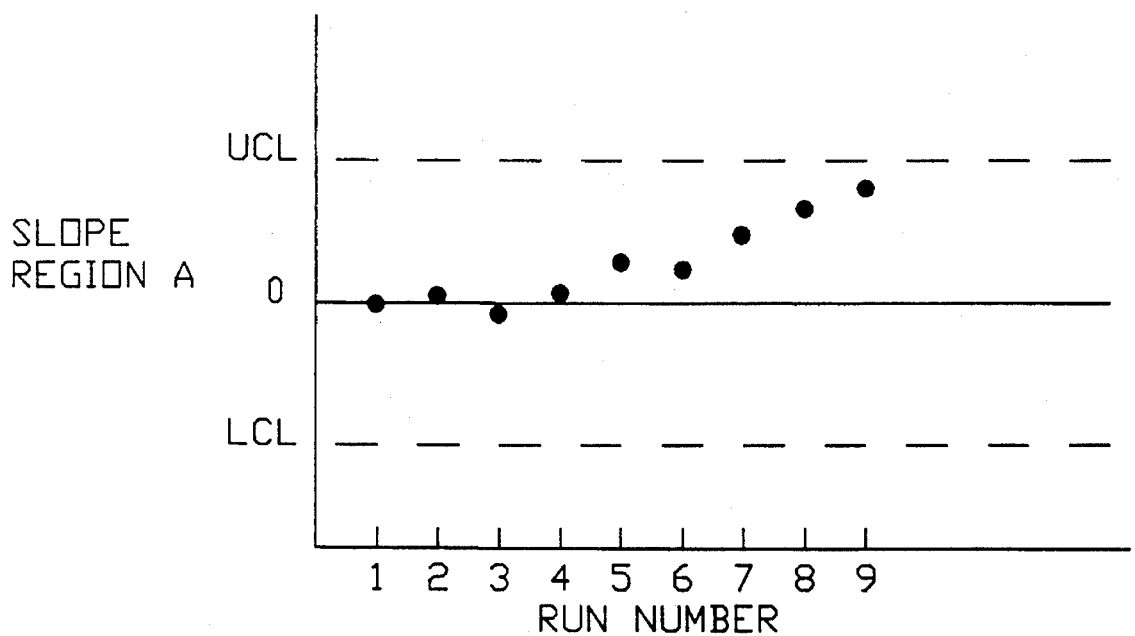
FIG. 16 illustrates the slope of deviation of region "A" of FIG. 15.

As a further example, of the monitoring process of the system/program, a bipolar diffusion process is examined. The system/program monitors the sheet resistance of the diffused layer as a function of time. The time varies as a function of the previously measured base sheet resistance in order to compensate for base diffusion junction depth variations, creating a constant current gain of the vertical NPN transistors. The control algorithm is be displayed as illustrated in FIG. 13. The value [(actual sheet)—(expected sheet)] is plotted to indicate process stability, as illustrated in FIG. 14 . Using statistical analysis, the system/program would detect a rule set violation at run 9 and shift the algorithm coefficient from b to b'. If b' was within b(min) to b(max), the operation would be allowed to continue processing with no cause identified for the shift of b to b'. The system/program would also be trend tracking the equipment transient component slope of region (A), FIG. 12. If the furnace controller partially failed after run (4) of FIG. 14, then the trace of the run might be displayed as illustrated in FIG. 15, and the trend chart of the slope of the transient region (A) would be as illustrated in FIG. 16.

Using statistical analysis of the machine or wafer slope trend charts alone, a statistically valid decision by the program that a process drift had occured would not be possible until after run (9).

FIGS. 17–22 are plots of machine and wafer operation statistics that are available on-line to permit monitoring of system and work cell operations.

Figures 17, 18:
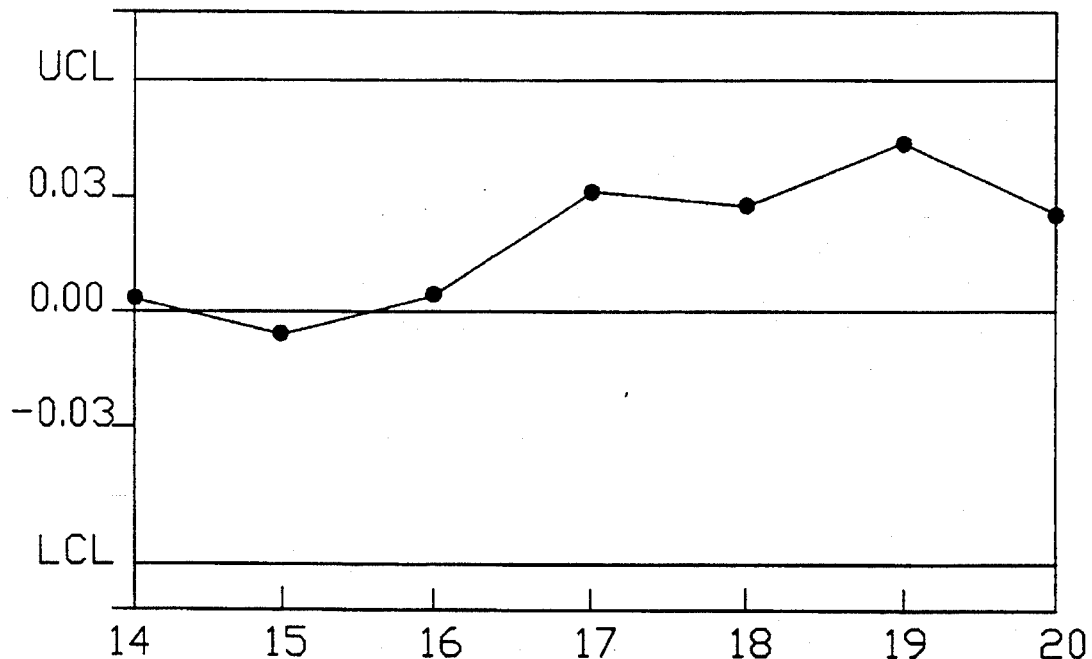
FIG. 17 is a summary of sheet resistance and delta sheet resistance.
FIG. 18 illustrates delta sheet resistance by run.

FIG. 17 lists a particular run number, the predicted sheet resistance for the run, the actual sheet resistance and the delta between predicted and actual.

FIG. 18 is an example chart and is used to show a plot of delta sheet resistance by run.

Figure 19:
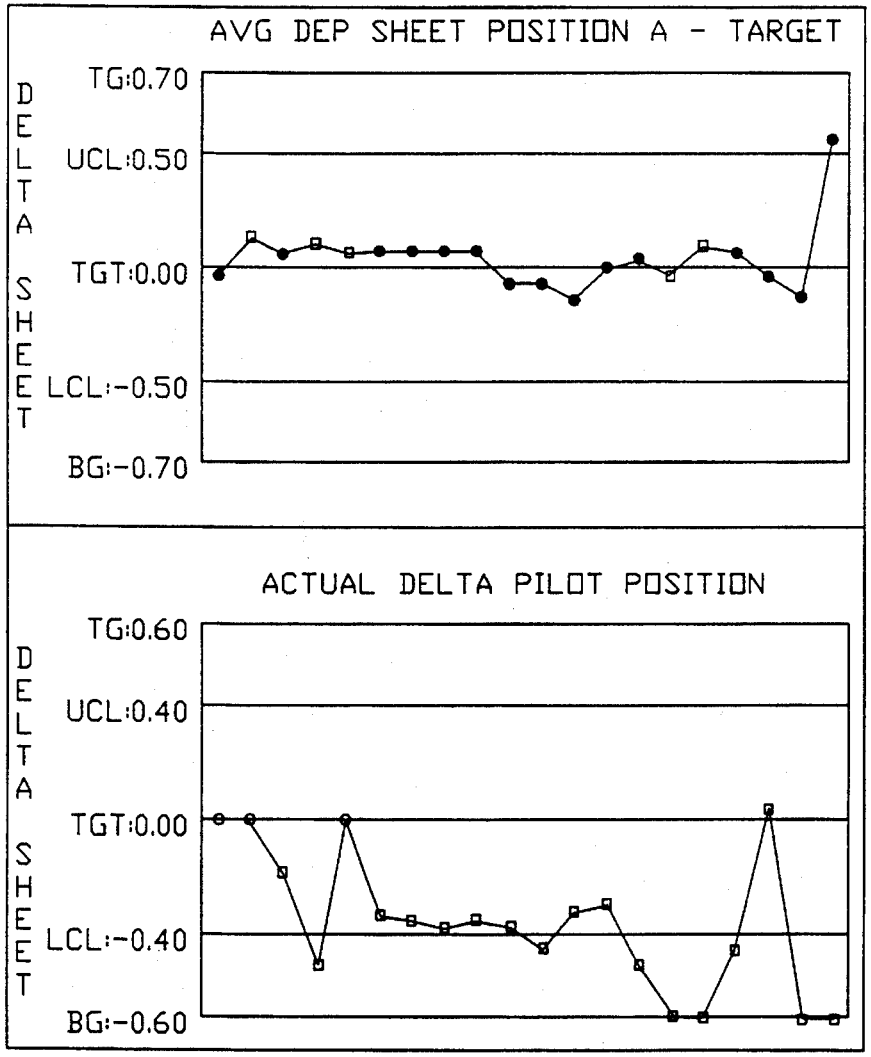
FIG. 19 is a plot of wafer measurements plotted by production run.

FIG. 19 is a plot of wafer measurements plotted in delta to predict model sheet resistance by run.

Figure 20:
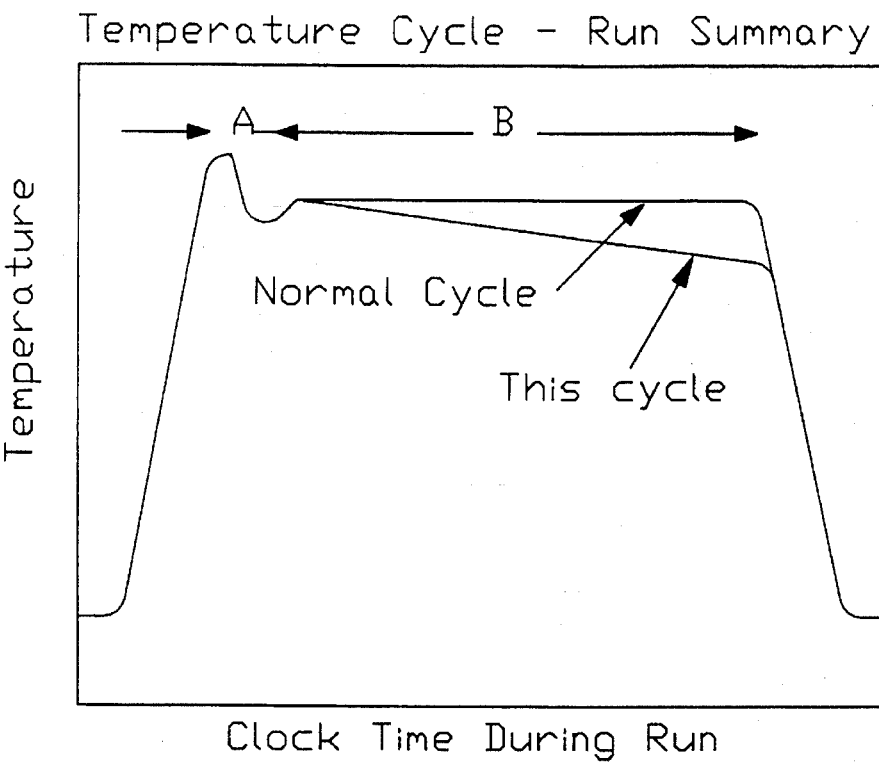
FIG. 20 illustrates a rum summary for a temperature cycle.

FIG. 20 is a temperature cycle run summary showing a normal cycle and a error cycle.

Figure 21:
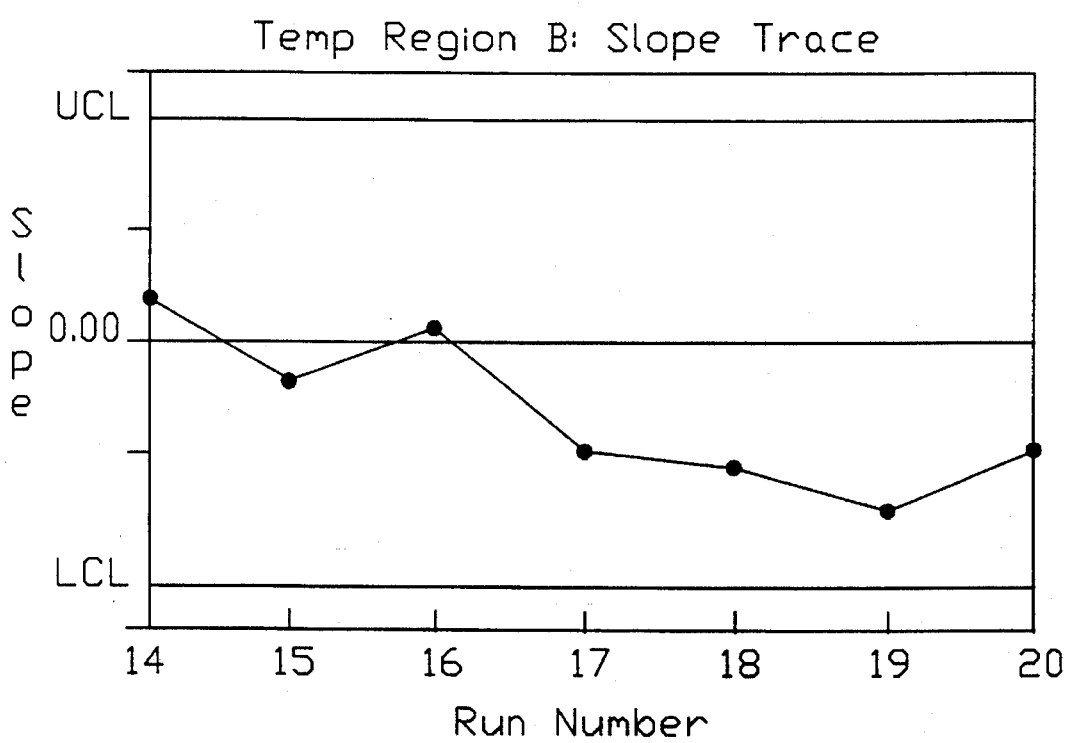
FIG. 21 is a temperature slope trace for a series of runs.

FIG. 21 is a temperature slope trace for Region b of FIG. 20 illustrating the drop in slope due to machine malfunction.

Figure 22:
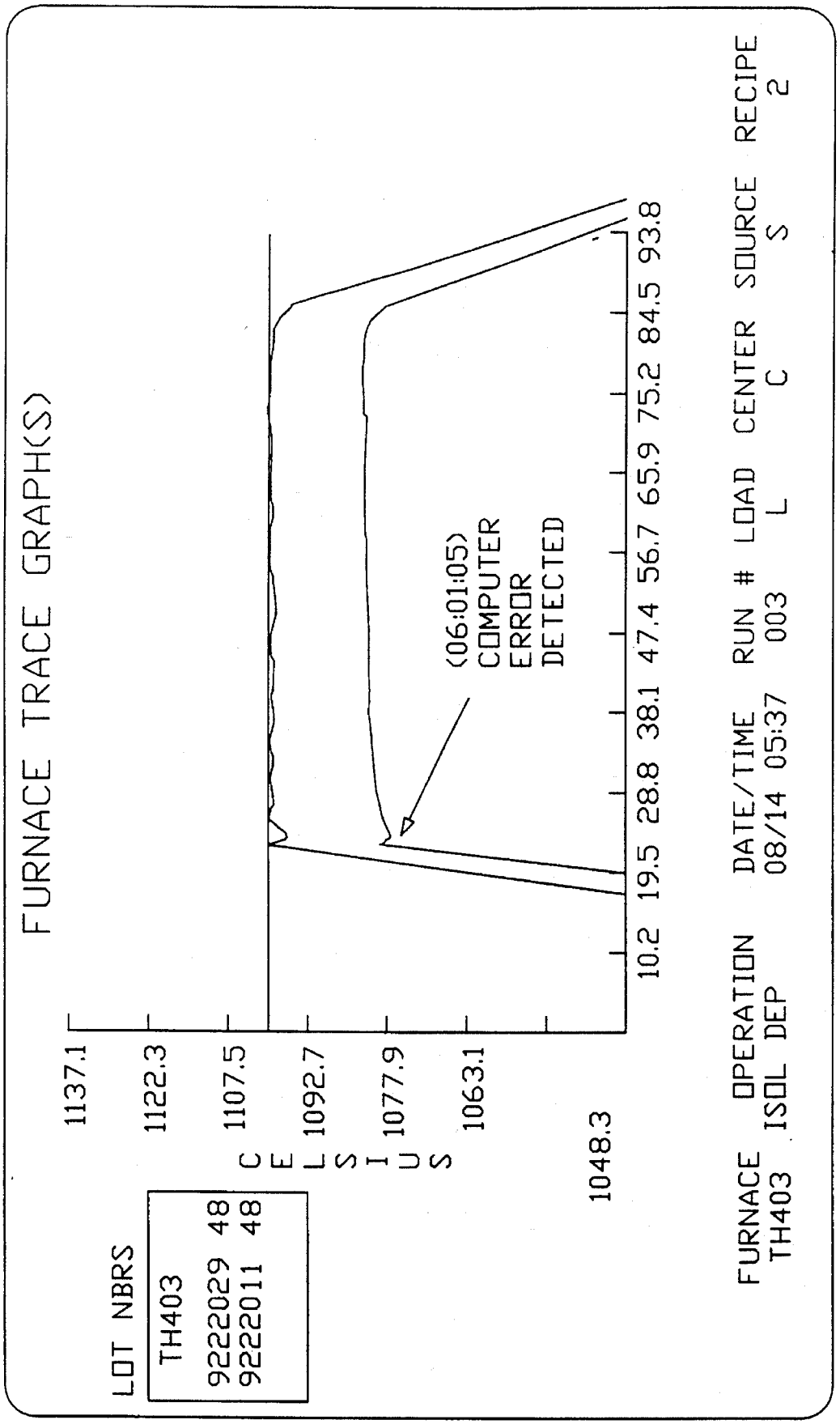
FIG. 22 is a furnace trace illustrating a computer error.

FIG. 22 is a furnace trace graph illustrating when a macine malfunction is detecteed by the computer. Lot numbers 9222029-48 and 9222011-48 for furnace TH403 are affected. See FIG. 19 for product results of this malfunction in the two graphs.

The system/program has access to both wafer and machine trend charts for comparison and correlation and, provides the ability to make a much faster statistically valid determination that a real shift had occurred after run (6). The program then analyzes the trend interaction matrix (both wafer and machine) to chose the proper action path for the observed data. Because of the correlating trends, the system/program decision in this case would be to leave the material control algorithm as in (value=b) and instruct the operator or engineering staff to investigate equipment modes that would cause a slow, undetected temperature increase during high temperature processing after run 6.

By coupling both the wafer and machine parametric data and analyzing them statistically, the cause of most process drifts are not only explained but identified and corrected much sooner than analyzing the wafer or machine parameters alone.

What is claimed:

1. A system for equipment monitoring and tracking of semiconductor manufacturing processes, comprising:

a semiconductor process work cell including at least one implanter;

a computer storing a dosage versus sheet resistance model for said implanter; and an interface between said process work cell and said computer for supplying on a real time basis the operating parameters of the implanter to said computer, said computer detecting a daft away from an expected value of sheet resistance and recalculating said model based on said operating parameters to determine a new expected value of sheet resistance, said computer forcing a shutdown of said implanter if the new expected value of sheet resistance is outside of a range of acceptable sheet resistances.

* * * * *